United States Patent [19]

Zipfel, Jr.

[11] 4,407,054

[45] Oct. 4, 1983

[54] METHOD OF MAKING ELECTROMECHANICAL TRANSDUCERS USING IMPROVED FLEXIBLE COMPOSITE PIEZOELECTRIC MATERIAL

[75] Inventor: George G. Zipfel, Jr., Summit, N.J.

[73] Assignee: Bell Telephone Laboratories, Incorporated, Murray Hill, N.J.

[21] Appl. No.: 201,473

[22] Filed: Oct. 28, 1980

[51] Int. Cl.$^3$ ............................................... H01L 41/22
[52] U.S. Cl. ................................. 29/25.35; 252/62.9; 310/358; 310/800; 310/357
[58] Field of Search ............... 29/25.35; 310/357, 358, 310/800; 252/62.9

[56] References Cited

U.S. PATENT DOCUMENTS

| | | | |
|---|---|---|---|
| 2,420,864 | 5/1947 | Chilowsky | 310/357 X |
| 3,070,775 | 12/1962 | Andrews, Jr. | 310/357 X |
| 4,128,489 | 12/1978 | Seo | 252/62.9 R |
| 4,227,111 | 10/1980 | Cross et al. | 252/62.9 |

FOREIGN PATENT DOCUMENTS

54-120899 9/1979 Japan ................... 310/800

OTHER PUBLICATIONS

"New Flexible Transducer Material . . . "; *Electronics;* 3-79; p. 57.

"Piezoelectric Properties . . . "; Furokawa et al.; *Journal of Applied Physics;* vol. 50, pp. 4904–4912; 1979.

"Piezoelectric Relaxation in Composite Epoxy-PZT System . . . "; Furokawa et al.; Japanese Journal of Applied Physics; vol. 16, pp. 453–458; Mar. 1977.

*Primary Examiner*—Carl E. Hall
*Attorney, Agent, or Firm*—James H. Fox

[57] ABSTRACT

A method of making flexible composite piezoelectric materials exhibiting hydrostatic response and having a stable response over time is given. A prepolymer material is combined with a piezoelectric material and polarized by applying an electric field while inducing an electric dipole in the piezoelectric material, typically by applying hydrostatic pressure or changing the temperature. To ensure stable response characteristics, the polymer material is chosen to have a shear modulus of less than 20 pounds per square inch. To help ensure good contact between the piezoelectric material and the polymer material, controlled shrinkage may be induced in the composite materials by heat or the removal of a volatile material. The prepolymer material desirably has an electrical resistivity greater than $10^{10}$ ohm/meters. Typical piezoelectric materials include lithium sulfate and tartaric acid. Typical polymer materials include RTV rubber, urethanes, and polybutadienes, and may be in the form of oligomers.

12 Claims, No Drawings

METHOD OF MAKING ELECTROMECHANICAL TRANSDUCERS USING IMPROVED FLEXIBLE COMPOSITE PIEZOELECTRIC MATERIAL

FIELD OF THE INVENTION

This invention relates to electromechanical transducers comprising improved flexible composite piezoelectric material having a substantial hydrostatic response and improved long-term stability, and a method of making such material.

DESCRIPTION OF THE PRIOR ART

Piezoelectric materials develop a voltage when a pressure or a stress is applied thereto. Well-known piezoelectric substances include quartz crystals, Rochelle salt, etc. Recent development in the piezoelectric technology has centered around lead zirconate titanate (PZT) materials, which have a number of desirable properties, including high piezoelectric output voltages. However, this is a ceramic material which, like many other piezoelectric materials, is quite brittle and inflexible. A large class of applications requires flexible material capable of producing an output voltage due to an applied pressure, or conversely, producing a mechanical deformation when a voltage is applied. Recent work has been concerned with making composite piezoelectric materials comprising a flexible polymer matrix and a powdered piezoelectric material, typically PZT.

A certain class of applications for flexible piezoelectric material requires that the response be substantially hydrostatic; that is, the output voltage be substantially the same no matter the direction from which the pressure is applied to the material. These applications include hydrophones and other types of underwater transducers. In other applications, the hydrostatic property is not necessary; for example, telephone key pads, microphones, etc. Furthermore, in certain applications, especially underwater hydrophones, it is necessary that the piezoelectric composite material combine a low noise level with high output.

The PZT composite materials, noted above, are lacking in these requirements. In particular, PZT is a ferroelectric material, which typically requires that when made in a composite in a polymer matrix, the PZT crystals substantially touch each other to create a continuous path from one surface of the transducer to another. This is necessary to prevent depolarization effects from degrading the output voltage. However, this requirement typically results in a high noise component with transducers made from this material, due to the PZT crystallites coming into contact, and breaking contact, when the material is flexed. In addition, the hydrostatic response of PZT composite materials is substantially less than the response to other types of pressure; i.e., its major response is anisotropic.

Certain work has been directed towards piezoelectric composite material that is not comprised of ferroelectric piezoelectric material. The particles of these piezoelectric materials obtain an electric dipole when a hydrostatic pressure is applied. The orientation of the particles in a polymer matrix is then accomplished by applying an electric field simultaneously with pressure, producing a polarized piezoelectric composite material. For example, the use of tourmaline and tartaric acid in a polymer matrix is known; see, for example, U.S. Pat. No. 2,420,864. However, the present inventor has found that when made with typical polymer material according to the prior art processes, composite piezoelectric matrix materials exhibiting a substantial hydrostatic response do not have sufficient stability over a period of time, but rather the piezoelectric constant degrades substantially over a period of a few days or weeks. Therefore, it would be desirable to have a flexible composite piezoelectric material exhibiting hydrostatic response, high output, and low noise that does not substantially degrade over a lengthy period of time.

SUMMARY OF THE INVENTION

I have invented a piezoelectric device incorporating a stable flexible composite piezoelectric material comprising particles of a piezoelectric material dispersed in a polymer matrix. The material for the device is made by choosing a prepolymer material having in the polymerized state an elastic shear modulus small enough that the particle-matrix contact is maintained under conditions of use. Typically, the modulus is less than 20 pounds per square inch (138 kilo Pascal) over the operating temperature range, and preferably less than 10 pounds per square inch. In addition, the prepolymer material has an electrical volume resistivity of greater than $1 \times 10^{10}$ ohm-meters, and preferably greater than $5 \times 10^{10}$ ohm-meters. Dispersed into this prepolymer material are particles of a piezoelectric material exhibiting a substantial hydrostatic response. Tartaric acid or lithium sulfate monohydrate are preferred piezoelectric materials. While the prepolymer material is undergoing polymerization, the composite material is oriented for maximum piezoelectric sensitivity (i.e., polarized) by inducing an electric dipole moment in the piezoelectric particles while simultaneously applying an electric field. In one embodiment, the dipoles are induced by applying a hydrostatic pressure to the particles. Typically, a periodic pressure wave is applied in phase with a periodic electric field to obtain polarization. The frequency of this periodic wave, which is typically in the form of a square wave, is preferably greater than the dielectric relaxation time of the prepolymer mixture. In another embodiment, the dipoles are induced by changing the temperature of the particles. When polymerized, two or more electrodes are electrically coupled to the composite material to produce an electromechanical transducer. An optional further step produces shrinkage of the polymer material to ensure long-term contact with the piezoelectric particles dispersed therein. This may be accomplished by heating the polymer material, or introducing a volatile material into the prepolymer material and then removing it from the polymerized piezoelectric composite material.

DETAILED DESCRIPTION

The following detailed description relates to electromechanical transducers using improved flexible composite piezoelectric material, and a method of making this material.

In practicing the present invention, the dielectric constant of the piezoelectric material should be approximately the same as, and in any case within a factor of 5 of the dielectric constant of the polymer matrix material. For example, typical polymer matrix materials, including urethanes, etc., have a dielectric constant of about 3 to 5. For some polymers, the dielectric constant is as high as 10 or 20, typically when the polymer material itself exhibits a piezoelectric response. As for the typical piezoelectric materials used herein, lithium sulfate monohydrate has a dielectric constant of about 10.5 in the direction of maximum piezoelectric response, and tartaric acid has a dielectric constant of about 4.3, making them suitable in this regard for use with the common flexible polymer materials. A large disparity in the dielectric constants between the polymer matrix material and the piezoelectric material dispersed therein results in reduced piezoelectric output of the composite material.

It has been found that with materials chosen as above, hydrostatic piezoelectric output values are typically obtained which are believed to be comparable with those obtainable with piezoelectric materials having much larger piezoelectric constants. For example, PZT has a much larger piezoelectric charge constant than the present materials, yet when a similar volume fraction is placed in a typical polymer matrix, produces a substantially smaller charge hydrostatic response. This is due in part to the large mismatch in dielectric constants between the PZT and typical polymer materials, with the dielectric constant of PZT being typically greater than 1,000. In addition, because the piezoelectric particles dispersed within the polymer matrix herein are typically noncontacting to one another, the noise level of transducers made with this material is substantially less than for transducers made of composite material comprising PZT or other ferroelectric materials which depend upon interparticle contact to achieve a high sensitivity. Even when contact occurs between the piezoelectric particles used herein, the relatively close match between the dielectric constants of the particles and the polymer matrix results in less noise generation than would be typically the case for PZT or other ferroelectric particles in a polymer matrix.

Possibly one reason why the present piezoelectric materials have not been widely utilized prior to this time is the fact that the sensitivity of the composite material tends to degrade with time when made using typical polymer matrix material utilized in the prior art. I have found that by suitable choice of materials and suitable processing techniques, high stability over a period of at least several months can be obtained. I theorize that one of the chief causes of degradation is the development over a period of time of voids between the piezoelectric particles and the surrounding matrix material. These hinder the transmission of pressure from the matrix to the piezoelectric particles dispersed therein and hence reduce the output. I have found an effective method of reducing this effect is by the use of polymer matrix material having a low shear modulus.

In practicing the present invention, the shear modulus should be small enough so that good particle-matrix contact is obtained under operating conditions. Typically, the shear modulus should be less than 20 pounds per square inch. One convenient method of determining the shear modules of a material is by measuring the Young's modulus of elasticity and converting this to shear modulus by a known conversion; see, for example, *Handbook of Engineering Mechanics*, W. Flugge, ed., McGraw Hill (1962) at page 53-55. Note that this value corresponds to a modulus of elasticity in relevant cases of around 60 pounds per square inch, or about $4 \times 10^6$ dynes/cm$^2$ which is substantially lower than for prior art composite material; see, e.g., U.S. Pat. No. 4,128,489. In many cases, the low shear modulus is obtained with polymers having 4 or fewer monomer units, conventionally referred to as oligomers. Typically, the oligomers suitable for practicing the present invention have a molecular weight less than about 200.

It is believed that the above-noted voids are produced in part due to the expansion or distortion of the polymer matrix material caused by absorption of gases from the atmosphere, or due to the polymerization occurring at elevated pressure. It may also be due to the differing temperature coefficients of expansion of the piezoelectric particles and typical polymer matrix material. However, whatever the exact causes, the low shear modulus polymer material tends to continuously conform to the piezoelectric particles, reducing the incidence of voids in the material.

In addition, in the manufacture of these composite materials, it has been found that the incidence of voids can be reduced, and an increase in contact between the matrix and the particles can be achieved, by inducing shrinkage of the polymer matrix material. Some shrinkage is inherent in the polymerization process of many prepolymer materials, and this may be utilized for this purpose. However, excess shrinkage, greater than a few percent, and typically about 5 percent, of the prepolymer composite volume can produce a decrease in stability over time, presumably because voids and cracks are again introduced into the material. The controlled shrinkage of the present process is thus conducted so as to maximize stability for a given composite material. This may be accomplished by introducing a volatile agent, typically a solvent, into the prepolymer material, which is then removed following polymerization of the matrix material. A typical solvent for this purpose is hexane, typically introduced in the amount of 2 or 3 volume percent, with numerous others being possible. It is believed that the removal of the volatile agent results in a slight compression of the surrounding matrix material around the particles, as the matrix shrinks due to the removal of the volatile agent.

For proper polarization of the piezoelectric particles, viscosity of the prepolymer material is typically in the range of 500 to 4,000 centipoise. Higher viscosity material typically prevents the piezoelectric particles from orienting with the applied electric field, while much lower viscosity allows settling of the particles out of the prepolymer material. Furthermore, to avoid settling, the size of the piezoelectric particles is typically less than about 60 microns when used with prepolymers in the above viscosity range.

The piezoelectric particles used herein obtain an electric dipole form upon the application of hydrostatic pressure or a change in temperature. Either or both of these produce a distortion of the crystal lattice of such particles, inducing a dipole moment in the particles. To align the polar axis of the particles, an electric field is applied to the prepolymer composite material simultaneously with the inducing of the dipole moment during polymerization. Compensation currents are induced by the electric field. Therefore, in the case wherein the dipoles are induced by pressure, the field and hydrostatic pressure are applied intermittently, typically periodically, and most typically in phase with one another. A typical electric field is in the range of 100 kilovolts per meter to 1,000 kilovolts per meter. The electric field is typically applied in the form of a square wave. A peak hydrostatic pressure of approximately 500 to 5,000 pounds per square inch is typical for the materials used herein, and the form of the periodic pressure wave is typically also a square wave. The electric dipoles may also be induced in the piezoelectric particles by changing the temperature of the particles, according to the pyroelectric effect.

Surprisingly, it has been found that polarization fields substantially greater than about 1,000 kilovolts per meter (10 kilovolts per centimeter), and typically greater than about 200 kilovolts per meter (2 kilovolts per centimeter), actually result in a reduction in the degree of orientation of the particles, and hence of the piezoelectric constant of the resulting composite material. It is believed that this is due to the fact that the torque on a piezoelectric particle due to the dielectric polarization constant increases as the second power of the electric field, whereas the torque due to the piezoelectric polarization constant increases linearly with the applied field. At some value of the applied electric field, the dielectric polarization torque exceeds the piezoelectric polarization torque. Since the dielectric polarization torque tends to result in particle orientations having no average piezoelectric dipole moment parallel to the applied electric field, the use of excessively high electric fields results in a reduction in the piezoelectric output. In order to help avoid the above effect, it is also desirable to employ particles of the piezoelectric material that are relatively spherical, and avoid particles having an excessively long axis. For this purpose, the ratio of the major-to-minor axes of the piezoelectric particles is desirably less than about 3 to 1 and preferably less than 2 to 1.

It has further been found that a high electrical resistivity of the prepolymer material is desirable to reduce the compensation current resulting from the periodic pressure-induced polarization, or from the temperature-induced polarization. This current deposits charges at the particle-matrix interface, which tend to cancel the polarization and reduce the orientation torque on the piezoelectric particles. The resistance-capacitance (RC) time constant of the induced compensation current is related to the dielectric constant of the prepolymer matrix material and the resistivity of this material. Desirably, in the case of a pressure induced dipole moment and with a 5 Hz electric field frequency, and a prepolymer dielectric constant of 3, the volume resistivity is greater than $1 \times 10^{10}$ ohm-meters. For higher orienting electric field and pressure frequencies, the volume resistivity can be decreased proportionately. In the case of the temperature induced dipole moment, the resistivity is also preferably greater than this amount. It has been found that typical commercially available prepolymer material does not have such a high volume resistivity, and therefore a careful selection of prepolymer materials, or a purification step, is typically necessary.

The above-noted principles will be more fully explained by means of the following Examples.

EXAMPLE 1

The polymer matrix material is a urethane made by the polymerization of a ricinoleate isocyanate and castor oil substantially comprised of ricinoleate polyol as the prepolymer material. In this material was included approximately 15 volume percent of tartaric acid. The tartaric acid was prepared by grinding granular tartaric acid in a roller mill for approximately 6 hours to obtain a maximum particle size of approximately 150 microns diameter. This material was then sieved in a 63 micron sieve followed by a 45 micron sieve. The material which passed the 63 micron sieve but did not pass the 45 micron sieve was utilized. The resulting sieved tartaric acid was then mixed with castor oil until fully dispersed.

The mixture was degassed in a vacuum for approximately 1 to 2 hours and was then cooled to approximately 15 degrees C. to slow the polymer curing process. The tartaric acid/castor oil mixture was added to the isocyanate which then formed the prepolymer material. The amount of castor oil used was approximately 2 to 3 percent less than that which would produce a stoichiometric polymer, in order to produce a lower shear modulus polymer than is typically obtained. The prepolymer material was degassed in a vacuum for approximately 15 minutes. The prepolymer material was injected into an evacuated 3 inch diameter steel mold having two broad faces approximately 50 mils apart. A square wave of 5 Hz frequency and 200 volts peak magnitude was applied across the 50 mil thick prepolymer material in the mold, while also applying, by means of hydraulic pressure, a 5 Hz square wave which had a maximum pressure of 1,000 pounds per square inch, and a minimum pressure of approximately ambient atmosphere. The prepolymer material had substantially set in approximately 1 hour. It was then removed from the mold, and aluminized electrodes were applied to the broad surfaces of the composite material. The open circuit piezoelectric sensitivity was found to be approximately 75 millivolts for an applied hydrostatic pressure of 1 pound per square inch. The output capacitance of the assembly was approximately 100 picofarads. The shear modulus of the polymer matrix was about 5 pounds per square inch, resulting in a substantially stable sensitivity over time.

EXAMPLE 2

The polymer matrix material for this Example is the same urethane as for Example 1, except that standard proportions of prepolymer material were used to allow eventual full polymerization. Into the prepolymer was dispersed 40 volume percent lithium sulfate monohydrate. This mixture was injected into a mold as above, and polarized by the simultaneous application of an electric field meter and a hydrostatic pressure which decreased from about 2,500 psi to about 1,200 psi over a period of 5 hours. The mold was periodically tapped during polarization to prevent settling of the particles. The temperature of the mixture was decreased about 25 degrees Farenheit below room temperature (70 degrees F.) over a period of about 3 hours, which initially prevented full curing of the polymer matrix. The material when removed from the mold had an initially low shear modulus of about 5 psi, and an initial sensitivity of about 3 pico coulombs per newton. As the polymer matrix material cured over a period of about 2 weeks at room temperature, the shear modulus increased to about 30 psi, and the sensitivity decreased to less than one-tenth the original value. It is estimated that a final shear modulus of less than 20 psi, and preferably less than 10 psi, would substantially prevent or reduce the decrease in sensitivity.

In the case of Example 2, it has been found that the electric dipole moment was induced primarily by the change in temperature, and only secondarily by the application of pressure. Instead of a reduction in temperature, an increase in temperature can be used to induce the dipole moment. However, it has been found more difficult to reliably reproduce the conditions leading to the temperature-induced dipole, making the pressure-induced embodiment, as in Example 1, the presently preferred technique.

Increasing the volume fraction of piezoelectric particles in the composite material results in a proportional increase in the sensitivity of the composite material. However, with volume fractions of piezoelectric particles above approximately 20 percent of the composite material, it has been found desirable to use an ultrasonic vibration scheme while polarizing the material during the polymerization of the prepolymer material. This is typically accomplished by placing the mold containing the prepolymer material is an oil bath and applying ultrasonic energy to the bath during the polarization process noted above. This helps the particles rotate should they contact each other during the orientation process, resulting in a higher output response.

While the above invention has been described in terms of exemplary embodiments, it will be apparent to those skilled in the art that various other piezoelectric materials and polymer materials may be utilized in practicing the present invention. The composite piezoelectric material may be made in numerous configurations for a wide variety of applications. Electrodes may be in physical contact with the composite material, or may be capacitively coupled to the material, or electrically coupled by other means, in order to form a transducer. The inverse piezoelectric effect may be utilized, whereby an electrical signal is coupled to the composite material, and mechanical deformation produced, for use as a loudspeaker or a headphone element, etc. All such embodiments are included in the term "electromechanical transducer". In addition, the response characteristic of the composite material may be modified for use in a given transducer. For example, for a headphone or microphone element operating in air, the very soft, flexible composite material produced herein may be mounted in contact with a stiffer flexible element, or supported around the edges by a relatively inflexible element, etc., to produce a better mechanical impedance match to air, according to principles known in the art. The material may also be constrained to prevent flexing in one or more directions to modify the hydrostatic response characteristics. To improve the resistance to moisture, or otherwise protect the soft piezoelectric composite material, the composite material may be coated with, or encapsulated in, various other materials, including polymers. While the coating or encapsulant should allow pressure transmission to the composite material, it need not have as low a shear modulus as the composite material. All such variations and deviations which rely on the basic teachings through which the present invention has advanced the art are within the spirit and scope of this invention.

I claim:

1. A method of making a flexible composite piezoelectric material by steps comprising polarizing particles of a piezoelectric material that are dispersed in a prepolymer material by applying an electric field to said prepolymer material, while simultaneously inducing a dipole moment in said particles, wherein said prepolymer material at least partially polymerizes during said polarizing, CHARCTERIZED IN THAT the shear modulus of the at least partially polymerized material after said polarizing is (less than 20 pounds per square inch) sufficiently small that the hydrostatic piezoelectric response of said composite is substantially stable over time, and wherein said electric field is in the range of 100 to 1,000 kilovolts per meter, and the ratio of the major-to-minor axes of said piezoelectric particles is less than 2 to 1, and wherein said piezoelectric material is selected from the group consisting of lithium sulfate monohydrate and tartaric acid.

2. The method of claim 1 FURTHER CHARACTERIZED in that said inducing a dipole moment is accomplished by applying a periodic hydrostatic pressure to said particles, and said electric field is a periodic electric field substantially in phase with said periodic pressure.

3. The method of claim 1 FURTHER CHARACTERIZED in that said inducing a dipole moment is accomplished by changing the temperature of said particles.

4. The method of claim 1 FURTHER CHARACTERIZED in that said polymer material remains substantially underpolymerized following said polarizing step.

5. The method of claim 1 FURTHER CHARACTERIZED in that the volume resistivity of said prepolymer material is greater than $1 \times 10^{10}$ ohm-meters.

6. The method of claim 1 FURTHER CHARACTERIZED by the further step of inducing shrinkage of the at least partially polymerized material so that the temporal stability of the piezoelectric response of the composite piezoelectric material is substantially increased.

7. The method of claim 6 FURTHER CHARACTERIZED by accomplishing said shrinkage by including a volatile material in said prepolymer material during said polarizing step and removing said volatile material after the at least partial polymerization of said prepolymer material.

8. The method of claim 1 FURTHER CHARACTERIZED by applying ultrasonic vibration to said prepolymer material during the polymerization process.

9. The method of claim 8 FURTHER CHARACTERIZED in that said piezoelectric material comprises greater than 20 volume percent of said composite material.

10. The method of claim 1 FURTHER CHARACTERIZED in that said polymer material is a urethane.

11. the method of claim 1 FURTHER CHARACTERIZED by electrically coupling at least 2 electrodes to said composite material.

12. The method of claim 1 wherein said shear modulus after polarizing is less than 20 pounds per square inch.

* * * * *

UNITED STATES PATENT AND TRADEMARK OFFICE
CERTIFICATE OF CORRECTION

PATENT NO. : 4,407,054
DATED : October 4, 1983
INVENTOR(S) : George G. Zipfel, Jr.

It is certified that error appears in the above—identified patent and that said Letters Patent is hereby corrected as shown below:

In the claims, column 8, line 5, "polarizing is (less than 20 pounds per square inch)" should read --polarizing is--. Column 8, line 53, "the" should read --The--.

Signed and Sealed this

Twenty-seventh Day of November 1984

[SEAL]

Attest:

GERALD J. MOSSINGHOFF

*Attesting Officer*  *Commissioner of Patents and Trademarks*